June 25, 1963 E. O. KEIZER 3,095,533

VOLTAGE CONTROL CIRCUITS

Filed Jan. 28, 1960

INVENTOR.
Eugene O. Keizer
BY Eugene M. Whitacre
ATTORNEY

United States Patent Office 3,095,533

Patented June 25, 1963

3,095,533

VOLTAGE CONTROL CIRCUITS

Eugene O. Keizer, Princeton, N.J., assignor to Radio Corporation of America, a corporation of Delaware Filed Jan. 28, 1960, Ser. No. 5,157
11 Claims. (Cl. 321—2)

Figures 1, 2:
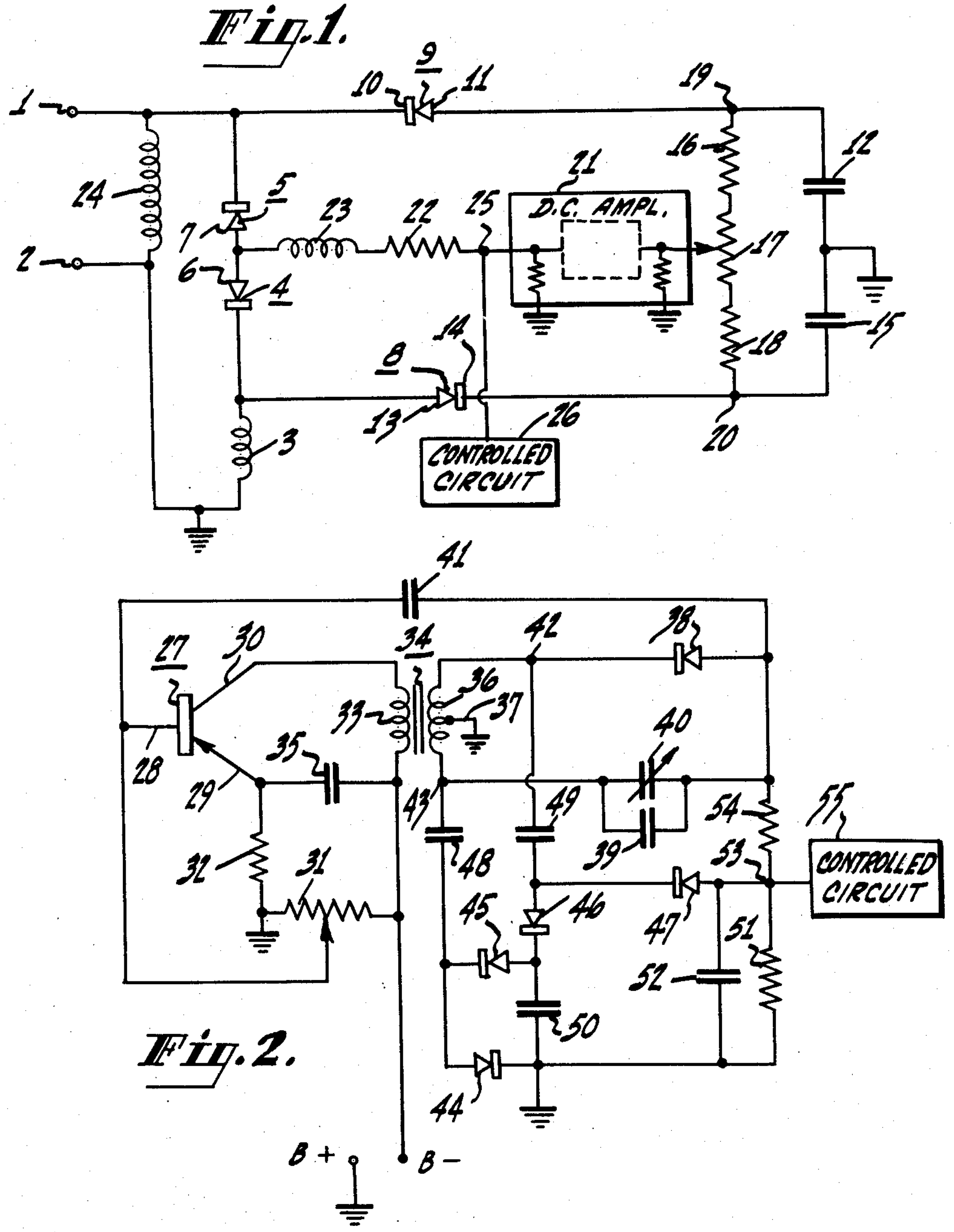

This invention relates to electrical control circuits and more particularly relates to direct voltage control circuits utilizing voltage-responsive variable-capacitance diodes.

It has been found that circuits using the capacitance characteristic of voltage-responsive variable-capacitance diodes are relatively difficult to maintain in stable operation. This is due to the fact that known types of variable-capacitance diodes are temperature responsive to the extent that a relatively small change in temperature causes a significant change in the capacitance of the diode. Furthermore variations in reverse biasing voltage due to line voltage fluctuations, aging of batteries and the like also cause undesirable diode capacitance changes.

Accordingly, it is an object of this invention to provide an improved source of D.C. (direct current) voltage for reverse biasing variable-capacitance diodes in controlled electrical circuits which will automatically compensate for the effects of temperature changes, supply voltage variations and the like on the capacitance of the controlled diodes.

It is another object of this invention to provide an improved voltage-responsive, variable-reactance, voltage control circuit which automatically compensates for changes in the variable reactance due to temperature change, supply voltage variations and the like.

In accordance with the invention, an oscillatory voltage is applied to a reactive circuit comprising a voltage-responsive variable-capacitance control diode coupled in series with a reactance element. Means are provided for deriving a D.C. control voltage whose magnitude is a function of the capacitance of the control diode. The D.C. control voltage is applied to the control diode in a manner to counteract undesirable changes in control diode capacitance due to temperature variations and the like. The D.C. control voltage may be used to reverse bias similar variable-capacitance diodes in other circuits, such as tuning circuits which are subject to substantially the same ambient conditions as the control diode.

In accordance with a feature of the invention, a parameter of the control circuit may be varied to change the ratio of reactances of the control diode and the reactance element to control the magnitude of the stabilized D.C. control voltage. In this manner, the capacitance of variable capacitance diodes in the other circuits subject to the same ambient temperature conditions may be varied over a range of capacitance values. The control circuit not only has the advantage of automatically stabilizing the operation of the controlled diodes but also results in a relatively linear tuning control characteristic.

An additional feature is that an embodiment of the invention may be used as a voltage regulator to stabilize the voltage of a controlled circuit. Furthermore this embodiment of the invention may also be used as an amplifier of D.C. voltages.

The novel features which are considered to be characteristic of this invention are set forth with particularity in the appended claims. The invention itself, both as to organization and method of operation will best be understood by referring to the accompanying drawings and the following description in which:

FIGURE 1 is a schematic circuit diagram of a direct voltage control circuit embodying the invention; and FIGURE 2 is a schematic circuit diagram of an embodiment of a direct voltage control circuit in accordance with the invention which includes a controlled oscillatory voltage source.

Referring to the drawings and particularly to FIGURE 1, the control circuit includes a pair of terminals 1 and 2 for connection to a source of oscillatory voltage, not shown. The oscillatory voltage is applied to a reactive circuit comprising the series combination of a fixed inductor 3 and a pair of variable-capacitance diodes 4 and 5. The reactive circuit is tuned to be capacitive at the frequency of the applied oscillatory voltage. The anodes 6 and 7 of diodes 4 and 5 are connected together so that an increase in capacitance of one diode due to the peak values of the applied oscillatory voltage will be counteracted by a decrease in capacitance in the other diode, resulting in a substantially constant total capacitance.

A pair of rectifiers 8 and 9 are provided to rectify the A.C. (alternating current) voltages developed across different portions of the reactive circuit. The rectifier 9 has a cathode 10 connected to the terminal 1 and an anode 11 connected through a bypass capacitor 12 to ground. The rectifier 8 has an anode 13 which is connected to the junction of the inductor 3 and the diode 4 and has a cathode 14 which is connected through a bypass capacitor 15 to ground. In effect the A.C. voltage developed across the entire reactive circuit is applied to the rectifier 9 but only the A.C. voltage developed across inductor 3 is applied to the rectifier 8.

A voltage divider comprising the series combination of a fixed resistor 16, a potentiometer 17 and a fixed resistor 18 is connected from a terminal 19 at the anode of the rectifier 9, to a terminal 20 at the cathode of the rectifier 8. The potentiometer 17 includes an adjustable arm which is connected to the input terminal of a suitable D.C. amplifier 21. The amplifier shown in FIGURE 1 includes a high resistance D.C. input circuit which provides a D.C. return path for the rectifiers 8 and 9 and a low resistance D.C. output circuit which comprises a portion of the D.C. paths for reverse biasing the diodes 4 and 5. The amplifier 21 may, for example, be a Kay Lab Model 103 D.C. amplifier which also is a polarity inverter.

The output circuit of the D.C. amplifier 21 is connected through a current limiting resistor 22 and an R.F. choke coil 23 to supply reverse biasing voltage to diodes 4 and 5. Current limiting resistor 22 prevents damage to diodes 4 and 5 due to excess minority carrier current flow and R.F. choke coil 23 isolates the D.C. amplifier 21 from the oscillatory voltage. An R.F. choke coil 24 is connected from the terminal 1 to ground to complete the D.C. reverse bias circuit for the diode 5. A terminal 25 connected to the output circuit of the D.C. amplifier 21 provides a reverse biasing voltage which may be applied to diodes in a controlled circuit 26, electrically connected thereto. The controlled circuit 26 contains diodes similar to control diodes 4 and 5 and the controlled diodes are located in a position to be subjected to similar ambient conditions as diodes 4 and 5.

The A.C. voltages developed across portions of the reactive circuit comprising the diodes 4 and 5 and the inductor 3, are rectified by rectifiers 8 and 9. The A.C. voltage developed across the entire reactive circuit is applied to rectifier 9 but only the portion developed across inductor 3 is applied to rectifier 8. The rectifiers will conduct on the same half cycles of the applied oscillatory wave, and the D.C. output voltages from the rectifiers appearing at the terminals 19 and 20, will be opposite in polarity.

The D.C. output voltages from rectifiers 8 and 9 are developed across a series resistance voltage divider connected between terminals 19 and 20. Terminal 19 is fixed at a negative D.C. potential due to the poling of rectifier 9. The potential level will be approximately equal in magnitude to the peak value of the applied oscillatory voltage amplitude. Terminal 20 is at some positive D.C. potential level. Consequently, a zero potential position will exist at some intermediate point between terminals 19 and 20. The adjustable arm of potentiometer 17 is positioned at some point closer to the positive terminal 20 so that a negative reverse biasing voltage is applied to diodes 4 and 5 and to the terminal 25 due to the polarity inversion of the D.C. amplifier 21.

If the ambient temperature increases, the capacitance of diodes 4 and 5 will also increase because of their temperature-responsive characteristics. The capacitive reactance will therefore decrease. The total impedance of the reactive circuit, comprising the diodes 4 and 5 and inductor 3 will also decrease since the circuit is tuned to be capacitive at the frequency of the applied oscillatory wave. Inasmuch as the impedance decreases, the A.C. current in the reactive circuit will increase. Therefore the A.C. voltage developed across inductor 3 will increase and the terminal 20 will become more positive. Terminal 19 will remain fixed at a negative potential level approximately equal to the peak value of the applied oscillatory voltage amplitude. Consequently, the potential level at the adjustable arm of potentiometer 17 will become more positive. The D.C. amplifier 21 will invert this error voltage and a greater reverse biasing voltage will be applied to diodes 4 and 5 through resistor 22 and R.F. choke 23. With greater reverse bias, the capacitance of diodes 4 and 5 will decrease and thereby substantially counteract the increased capacitance effect due to the temperature change. An opposite sequence would result if the capacitance of diodes 4 and 5 decreased due to a lowering of temperature. It is important that the reactive circuit does not go through its series resonant point into the inductive region. The circuit will function with the reactive circuit tuned to be inductive at the frequency of the applied oscillatory wave but the D.C. amplifier 21 should be connected so as not to invert the polarity of the voltage derived from the potentiometer 17.

If the controlled diodes in circuit 26 are of the same type as control diodes 4 and 5 then they will also be subject to the same changes of capacitance as diodes 4 and 5. Accordingly the reverse biasing voltage applied to the controlled diodes from the terminal 25 will result in a temperature stabilized capacitance of substantially the same magnitude as that exhibited by the diodes 4 and 5.

If the oscillatory supply voltage varies, the reverse biasing voltage applied to diodes 4 and 5 and controlled diodes in circuit 26 will not vary. For example, with an oscillatory voltage increase a greater voltage drop will occur across the entire reactive circuit. Since the capacitive and inductive reactances of the reactive circuit remain substantially the same, the A.C. voltages applied to rectifiers 8 and 9 remain in the same ratio. Thus the D.C. voltage at the adjustable arm of potentiometer 17 does not change, and therefore diodes 4 and 5 and controlled diodes in circuit 26 will be insensitive to changes in the peak amplitude of the applied oscillatory voltage.

Since the D.C. control voltage developed is dependent on the magnitudes of the reactances of the diodes 4 and 5 and inductor 3, any changes in the ratio of these reactances will generate a different control voltage. Therefore a range of biasing voltages generated at terminal 25 will tune circuits electrically connected thereto when the variable reactance elements in the tuned circuits are variable capacitance diodes similar to diodes 4 and 5. This can be accomplished by varying the frequency of the applied oscillatory voltage, the inductance of the inductor 3, or the position of the adjustable arm of the potentiometer 17. In addition to aiding in the linearization of the tuning control, there will be temperature compensation and insensitivity to supply voltage variation as well.

Referring to FIGURE 2, a feedback transistor oscillator is made an integral part of the direct voltage control circuit to provide the oscillatory voltage. The active element of the oscillator comprises a transistor 27, having base 28, emitter 29 and collector 30 electrodes. The base electrode 28 is connected to the adjustable arm of a potentiometer 31 which is connected between the B− and the B+ terminals of a D.C. supply voltage source, the B+ terminal being at ground potential level. An emitter stabilizing resistor 32 is connected from the emitter electrode 29 to ground. The collector electrode 30 is connected through a primary winding 33 of a transformer 34 to the B− terminal of the D.C. supply voltage source. A capacitor 35 is connected from the B− terminal to the emitter electrode 29 in order to bypass oscillatory current around stabilizing resistor 32 and thereby minimize degenerative current feedback.

A secondary winding 36 of transformer 34 has a center tap 37 which is grounded. A reactive circuit comprising a variable capacitance diode 38 and a parallel capacitor combination, including a fixed capacitor 39 and a variable capacitor 40, is connected in series across the secondary winding 36. A fixed capacitor 41 is connected from the junction of diode 38 and the parallel capacitor combination to the base electrode 28 to provide a voltage feedback path to the base-emitter input circuit of transistor 27.

A rectifier voltage multiplier circuit is also connected between the end terminals 42 and 43 of the secondary winding 36. The voltage multiplier includes four rectifiers 44, 45, 46 and 47. The anode of the rectifier 44 and the cathode of the rectifier 45 are connected to the terminal 43 through a capacitor 48, and the cathode of the rectifier 47 and the anode of the rectifier 46 are connected to the terminal 42 through a capacitor 49. The cathode of the rectifier 44 is directly grounded, and the anode of the rectifier 45 and the cathode of the rectifier 46 are connected to ground through a capacitor 50. The anode of the rectifier 47 is connected to ground through the parallel combination of a load resistor 51 and a capacitor 52.

A D.C. voltage developed across the resistor 51 and appearing at the terminal 53 is applied to the diode 38 through a resistor 54. Controlled diodes in a circuit 55 are electrically connected to receive a reverse biasing voltage from terminal 53.

The series connection of the diode 38 to the parallel combination of capacitors 39 and 40 across the secondary winding 36 forms a voltage-divider reactive circuit which is connected through a capacitor 41 to base electrode 28 of transistor 27 to constitute a voltage feedback path for unbalances in the reactive circuit. If the capacitances are equal, the junction between the diode 38 and the combination of capacitor 39 and 40 will be ground potential level since the center tap 37 of secondary winding 36 is grounded. Therefore no voltage feedback to the base-emitter input circuit of transistor 27 will occur. If the capacitances are not equal, the junction will not be at ground potential level and the unbalanced voltage will be fed back to transistor 27. Positive or regenerative feedback will occur in the circuit arrangement shown if the capacitance of diode 38 is greater than that of capacitors 39 and 40, and a 180° phase shift occurs between the voltage at the collector electrode 30 and the voltage at the terminal 42.

Initially when the circuit is first energized, there is an increase in the current flow in transistor 27. The changing current flow in the primary winding 33 induces a voltage in the secondary winding 36. The induced voltage is applied across the reactive circuit comprising the diode 38 and the capacitors 39 and 40. Initially the diode 38 is unbiased and therefore has a greater capacitance than that of capacitors 39 and 40. Consequently positive voltage feedback occurs and oscillations commence. The oscillatory voltage induced in the secondary winding 36 energizes the rectifier circuit which develops a D.C. voltage which is applied through resistor 54 to reverse bias the diode 38. The reverse biasing voltage will reduce the capacitance of the diode 38 to a value near that of the parallel capacitance combination of capacitors 39 and 40. The point of rest will occur when the feedback voltage has been reduced until it is just great enough to sustain oscillations.

The operation of the rectifier circuit is such that when the A.C. voltage appearing across the secondary winding 36 makes terminal 42 positive and terminal 43 negative, rectifiers 46 and 45 will conduct and charge capacitors 49 and 48 each to one-half of the total voltage induced in the secondary winding. On the next half cycle, the polarity of the induced voltage will reverse and the rectifiers 44 and 47 will conduct. On this half-cycle the voltages due to the electrical charges on capacitors 48 and 49 will add in series to the voltage induced across the secondary winding and will charge capacitor 52 to approximately double the total voltage induced across the secondary winding 36. The direction of charging current will place the terminal 53 at a potential which is negative with respect to ground.

Since the direct voltage developed at the terminal 53 is dependent on the peak value of the amplitude of the oscillatory voltage, which in turn is dependent on the ratio of reactances of the diode 38 and the parallel combination of capacitors 39 and 40, a variation of the ratio of reactances will generate a range of direct voltages at the terminal 53. The ratio can be changed in a variety of ways, such as by varying the capacitor 40 or moving the grounded tap 37 to various positions on the secondary winding 36. The oscillatory voltage can also be applied to the rectifier circuit in a variety of ways, as for example, in addition to that shown, by connecting the rectifier circuit directly across the primary winding 33 or across a separate coil coupled to either the primary winding 33, or the secondary winding 36.

The direct control voltage developed at the terminal 53 is applied to a controlled circuit 55, electrically connected thereto. Variable capacitance diodes in circuit 55 which are of the same type as diode 38 will experience the same capacitance changes as diode 38 if they are located so as to be subject to substantially the same ambient temperature conditions as diode 38. Temperature fluctuations which vary the capacitance of the diode 38 will alter the peak value of the oscillatory voltage amplitude and change the magnitude of the reverse biasing control voltage developed in the rectifier circuit. The changed reverse biasing voltage applied from the terminal 53 will counteract the capacitance change in the diode 38 and the controlled diodes in circuit 55 and achieve temperature stabilization. If the controlled diodes in circuit 55 are the variable reactance elements in tuned circuits, the direct voltage control circuit generates a range of tuning control reverse biasing voltages which are not only temperature stabilized and relatively insentive to supply voltage variations but, by proper shaping of the plates of variable capacitor 40, also achieve a nearly linear tuning control characteristic.

The embodiment of the invention shown in FIGURE 2 when operated as a voltage regulator will maintain a relatively stable direct voltage. Furthermore the principle of utilizing a voltage-responsive reactive circuit to generate D.C. control voltages dependent on the ratio of reactances in the reactive circuit permits the control circuit to be used in a balance detector for measurement and instrumentation purposes. It is also to be noted that the embodiment of the invention shown in FIGURE 2 includes a closed loop for feedback control of the bias on the diode 38. By opening the loop, as by disconnecting the end of the resistor 54 that is connected to the terminal 53, an amplifier is formed. The input terminal of the amplifier could be the now disconnected end of the resistor 54 and the output terminal would be the terminal 53. In addition, a different input terminal could be chosen. The tap 37 on the secondary winding 36 of the transformer 34 could be disconnected from ground and an input voltage applied to the tap 37.

What is claimed is:

1. An electrical circuit comprising in combination a voltage-responsive variable-capacitance diode and a reactance element coupled in series to form a reactive circuit, said reactive circuit adapted to receive an oscillatory electrical wave, means providing a first circuit coupled to said reactive circuit for deriving a D.C. control voltage the magnitude of which is a function of the ratio of reactances of said diode and said reactance element, and means providing a second circuit connecting said first circuit means to said diode for applying to said diode a D.C. bias voltage the magnitude of which is related to the magnitude of said D.C. control voltage.

2. An electrical circuit comprising in combination a voltage-responsive variable-capacitance control diode and a reactance element coupled in series to form a reactive circuit, said reactive circuit adapted to receive an oscillatory electrical wave, means providing a first circuit coupled to said reactive circuit for deriving a D.C. control voltage the magnitude of which is a function of the capacitive reactance of said control diode, means providing a controlled circuit including a voltage-responsive variable-capacitance diode of the same type as said control diode, and means providing a circuit connecting said first circuit means to said control diode and said controlled circuit diode for applying said D.C. control voltage to said control diode and said controlled circuit diode in a manner tending to counteract changes in the capacitance of said diode.

3. An electrical circuit as defined in claim 2 in which said controlled circuit diode is subject to substantially the same ambient temperature conditions as said control diode.

4. A tuning control circuit comprising in combination a voltage-responsive variable-capacitance control diode and a reactance element coupled in series and adapted to receive an oscillatory electrical wave, means for varying the ratio of reactances of said control diode and said reactance element, means providing a rectifying circuit coupled to said control diode and said reactance element for deriving a D.C. control voltage whose magnitude is a function of the ratio of the reactances of said diode and said reactance element, a controlled circuit including a voltage-responsive variable-capacitance diode of the same type and subject to substantially the same ambient temperature conditions as said control diode, and circuit means connecting said rectifying circuit to said control diode and said controlled circuit diode for applying said D.C. control voltage to said diodes in a manner to change their capacitance.

5. A tuning control circuit as defined in claim 4 in which said means for varying the ratio of reactances of said control diode and said reactance element is a variable frequency oscillatory electrical wave source.

6. A voltage control circuit comprising in combination a pair of voltage-responsive variable-capacitance diodes each having an anode electrode and a cathode electrode, means connecting together like electrodes of said diodes, an inductor, means connecting said inductor to the other electrode of one of said diodes in a series combination, means providing a circuit coupled to said inductor and said diodes for rectifying at least a portion of an oscillatory electrical wave applied to said series combination of said inductor and said diodes for deriving a D.C. control voltage the magnitude of which is a function of the ratio of reactances of said inductor and said diodes, and means applying said D.C. control voltage to said diodes in a manner to counteract changes in the capacitance of said diodes.

7. A voltage control circuit comprising in combination a pair of voltage-responsive variable-capacitance diodes each having an anode electrode and a cathode electrode, means connecting together like electrodes of said diodes, an inductor, means connecting said inductor to the other electrode of one of said diodes in a series combination adapted to receive an oscillatory electrical wave, means providing a first unilateral conducting device connected across said diodes and said inductor for deriving a first D.C. voltage of one polarity, means providing a second unilateral conducting device connected across only said inductor to derive a second D.C. voltage of opposite polarity to said first D.C. voltage, a voltage divider including an adjustable arm and a pair of terminals, means connecting said voltage divider from said first unilateral conducting device to said second unilateral conducting device so that said first D.C. voltage appears at one terminal and said second D.C. voltage of opposite polarity appears at the other terminal with a difference voltage appearing at said adjustable arm, and means for direct current conductively connecting said adjustable arm to said means connecting together like electrodes of said diodes to apply to said diodes a D.C. bias voltage the magnitude of which is a function of the adjustment of said adjustable arm.

8. An electrical control circuit comprising in combination a voltage-responsive variable-capacitance diode and a reactance element coupled in series to form a reactive circuit, a feed-back oscillator for producing oscillatory electrical waves, said feedback oscillator having an input circuit and an output circuit, means coupling said reactive circuit to said output circuit for receiving oscillatory electrical waves, means for regeneratively feeding back to said input circuit a portion of the oscillatory electrical waves developed across said reactive circuit, means providing a rectifying circuit coupled to said reactive circuit for deriving a D.C. control voltage the magnitude of which is a function of the amplitude of the oscillatory electrical waves, and means connecting said rectifying circuit to said diode to apply a D.C. bias voltage to said diode in a manner to counteract changes in the capacitance of said diode.

9. An electrical control circuit comprising in combination a voltage-responsive variable-capacitance diode and a variable capacitor coupled in series to form a reactive circuit, a transistor feedback oscillator for producing oscillatory electrical waves, said transistor having an input electrode, an output electrode and a common electrode, a transformer having a primary winding and a tapped secondary winding, means connecting the tap of said secondary winding to a point of reference potential, means connecting the primary winding of said transformer between said output and common electrodes, means connecting said reactive circuit across said secondary winding so that a 180° phase shift will occur between the oscillatory electrical waves appearing at said output electrode and at the secondary winding connected to said diode, means for regeneratively feeding back to said input electrode a portion of the oscillatory electrical waves developed across said reactive circuit, the portion being a function of the ratio of reactances of said reactive circuit, means providing a rectifying circuit coupled to said reactive circuit for deriving a D.C. control voltage, and means connecting said rectifying circuit to said diode to apply a D.C. bias voltage to control the feedback oscillatory waves.

10. An electrical control circuit comprising in combination a voltage-responsive variable-capacitance diode, said diode being responsive to ambient temperature changes, a variable capacitor, said variable capacitor coupled in series with said diode to form a voltage divider reactive circuit, a feedback oscillator for producing oscillatory electrical waves, means coupled to said feedback oscillator for supplying D.C. energization potential thereto, said feedback oscillator having an input circuit and an output circuit, means coupling said reactive circuit to said output circuit, means for regeneratively feeding back to said input circuit a portion of the oscillatory electrical waves developed across said reactive circuit, said oscillatory wave feedback being dependent upon the capacitance of said diode, a rectifier circuit, means coupling said rectifier circuit to said reactive circuit for deriving a D.C. control voltage whose magnitude depends on the capacitance of said diode, and means connecting said rectifier circuit to said diode to apply a D.C. bias voltage to said diode in a manner to substantially counteract changes in the capacitance of said diode due to temperature changes and D.C. energizing potential fluctuations.

11. An electrical control circuit comprising in combination a voltage-responsive variable-capacitance diode and a variable capacitor coupled in series to form a reactive circuit, a control circuit, a feedback oscillator for producing oscillatory electrical waves, said feedback oscillator having an input circuit and an output circuit, means coupling said reactive circuit to said output circuit for receiving oscillatory electrical waves, means for regeneratively feeding back to said input circuit a portion of the oscillatory electrical waves developed across reactive circuit, a rectifier multiplier circuit, means coupling said reftifier circuit to said reactive circuit to derive a D.C. control voltage the magnitude of which is a function of the capacitance of said diode, means connecting said rectifier circuit to said diode to apply a D.C. bias voltage in a manner to counteract changes in capacitance of said diode and means connecting said rectifier circuit to said control circuit to provide a stabilized D.C. control voltage.

References Cited in the file of this patent

UNITED STATES PATENTS

| | | |
|---|---|---|
| 2,881,380 | Kruger | Apr. 7, 1959 |
| 2,924,769 | Harriman et al. | Feb. 9, 1960 |

OTHER REFERENCES

"Circuit Design Using Silicon Capacitors," by J. Hammerslag published in Electronics (Sept. 18, 1959), pages 48–50.